(12) United States Patent
Axel

(10) Patent No.: US 7,215,123 B2
(45) Date of Patent: May 8, 2007

(54) METHOD, SYSTEM STORAGE MEDIUM AND SOFTWARE ARRANGEMENT FOR HOMOGENIZING A MAGNETIC FIELD IN A MAGNETIC RESONANCE IMAGING SYSTEM

(75) Inventor: Leon Axel, Philadelphia, PA (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 11/122,556

(22) Filed: May 4, 2005

(65) Prior Publication Data

US 2005/0248348 A1 Nov. 10, 2005

Related U.S. Application Data

(60) Provisional application No. 60/568,867, filed on May 5, 2004.

(51) Int. Cl.
*G01V 3/00* (2006.01)
(52) U.S. Cl. ...................... 324/318; 324/320
(58) Field of Classification Search ........ 324/300–322; 335/301; 600/410
See application file for complete search history.

(56) References Cited

U.S. PATENT DOCUMENTS

| | | | | |
|---|---|---|---|---|
| 4,122,386 A * | 10/1978 | Tomita et al. | .............. | 324/320 |
| 4,684,890 A * | 8/1987 | Briguet et al. | .............. | 324/309 |
| 4,761,614 A * | 8/1988 | Prammer et al. | ........... | 324/320 |
| 5,345,178 A * | 9/1994 | Manabe et al. | ............. | 324/320 |
| 5,391,990 A * | 2/1995 | Schmitt et al. | ............. | 324/320 |
| 5,539,316 A * | 7/1996 | Sukumar | .................... | 324/320 |
| 5,592,091 A * | 1/1997 | Manabe | ..................... | 324/320 |
| 6,342,787 B1* | 1/2002 | Petropoulos et al. | ....... | 324/320 |
| 6,825,667 B1* | 11/2004 | Tsuda | ........................ | 324/320 |
| 6,980,847 B2* | 12/2005 | Peshkovsky et al. | ....... | 600/414 |
| 2004/0264751 A1* | 12/2004 | Avinash | .................... | 382/128 |

* cited by examiner

*Primary Examiner*—Brij B. Shrivastav
(74) *Attorney, Agent, or Firm*—Dorsey & Whitney LLP

(57) ABSTRACT

A method and system for homogenizing a main magnetic field of a magnetic resonance imaging ("MRI") system includes obtaining a main magnetic field distribution generated by the MRI system, obtaining at least one shim magnetic field distribution generated by at least one shim coil of the MRI system, and determining a corresponding shim current based on a relationship between the main magnetic field distribution and the at least one shim magnetic field distribution.

33 Claims, 5 Drawing Sheets

METHOD, SYSTEM STORAGE MEDIUM AND SOFTWARE ARRANGEMENT FOR HOMOGENIZING A MAGNETIC FIELD IN A MAGNETIC RESONANCE IMAGING SYSTEM

CROSS-REFERENCE TO RELATED APPLICATION(S)

This application claims the benefit of U.S. Provisional Patent Application No. 60/568,867, filed May 5, 2004, entitled METHOD AND SYSTEM FOR HOMOGENIZING A MAGNETIC FIELD IN A MAGNETIC RESONANCE IMAGING SYSTEM, which is incorporated by this reference as though fully set forth herein.

FIELD OF THE INVENTION

The present invention relates generally to magnetic resonance methods and systems. In particular the present invention relates to methods for homogenizing the magnetic field of a magnetic resonance imaging system, and to systems utilizing such methods.

BACKGROUND INFORMATION

Magnetic resonance imaging ("MRI") systems generally use strong magnetic fields in order to polarize the magnetic spins of nuclei to be imaged and to create the magnetic resonance condition therein. The magnetic fields should be approximately uniform (i.e., homogeneous) in order to perform high quality magnetic resonance imaging or spectroscopy of the nuclei. While magnets used to produce these fields are specifically designed and manufactured to achieve fairly high levels of homogeneity, typically additional local supplemental magnetic fields (e.g., the "shim fields" or "shims") are added to achieve the final desired level of magnetic field homogeneity. There is a need for these shims because of residual field variations resulting from the magnet's manufacturing, and because of the alterations of the magnetic field resulting from the presence within the magnet of the subject to be imaged. These subject-dependant effects are important at higher magnetic field strengths, which are increasingly being utilized. The shim fields vary in predetermined ways with position, depending on the construction of the coils that generate the shim fields, and their strength can be controlled, by changing the current that passes through the shim coils. While the shim coils are generally designed to have approximately polynomial dependence on position, this approximation may break down away from the isocenter of the magnet. In the process of shimming the magnetic field, a combination of shim field strengths is generally sought that will locally compensate for the residual magnetic field variations.

The shim fields can typically be generated in either of two ways. One way this can be accomplished is by using pieces of magnetizable metal placed appropriately around the region to be imaged (typically referred to as "passive shimming"). Another way this could be done is by using current flowing in sets of conducting elements ("shim coils") incorporated in the magnet housing which have been designed to have different specific locally varying magnetic field patterns whose overall strength is proportional to the currents (typically referred to as "active shimming"). In the latter method, the currents flowing in the shim coils can be adjusted so that their combined magnetic fields at least partially balance out the residual areas of inhomogeneity of the main magnetic field.

The determination of which combinations of shim currents to use can be carried out as follows: (1) by interactively adjusting the different currents with a sample in place in the magnet, and analyzing the resulting effect on the magnetic resonance signal from the sample, traditionally performed in a magnetic resonance spectroscopy, and/or (2) by imaging the spatial distribution of the magnetic field within the sample with a suitably modified MRI method and seeking the best combination of shim fields to minimize the observed field inhomogeneity. The first approach is taken usually in traditional Nuclear Magnetic Resonance ("NMR") spectroscopy systems. The second approach can be implemented when the MR system has imaging capabilities, whereby an image can be created of the magnetic field variation within the object being analyzed. Such imaged field data can be obtained as a 3-D image or as a set of 2-D images in different locations and orientations. In addition, NMR systems used primarily for spectroscopy can be used to generate such images using the linear shims as imaging gradients.

Thus, if a predetermined set of maps of the spatial variation of the shim fields is available, such maps can be used to calculate the optimal combination of shim fields to be used to compensate for the main field inhomogeneity. Previous methodologies for performing this calculation have focused on iterative or least squares type approaches to seeking an optimal combination of shim fields. The exemplary system and method according to the present invention is provided for calculating such combination of shim fields to correct for a magnetic field inhomogeneity but without the need for an iterative approach. The following references are incorporated herein by reference in their entirety: Van Zijl et al., "Optimized Shimming for High-Resolution NMR Using Three-Dimensional Image-Based Field Mapping," Journal of Magnetic Resonance, Series A 111, 203–207 (1994); Hu et al., "A Fast, Reliable, Automatic Shimming Procedure Using 1H Chemical-Shift-Imaging Spectroscopy," Journal of Magnetic Resonance, Series B 108, 213–219 (1995).

OBJECTS AND SUMMARY OF THE INVENTION

One of the objects of the present invention is to overcome the aforementioned problems and deficiencies. For example, in an exemplary embodiment of the method and system according to the present invention, a corresponding shim current to correct the inhomogeneity of a main magnetic field distribution generated by an MRI system can be determined based on a generalized projection of the main magnetic field onto a basis set of orthogonalized shim fields.

With the spatial distributions of the shim fields produced by unit currents in the shim coils, and the spatial distributions of the magnetic field to be shimmed (along with the volume over which shimming is to be performed), an equivalent set of orthogonalized shim fields and the corresponding components of the original shim fields can be determined. These shim fields can then be used as a basis set to locate the components of the main magnetic field along the equivalent set of orthogonalized shim fields. Then such shim fields are used to ascertain the corresponding currents along the original shims preferable to cancel them out within the desired region whose homogeneity is to be optimized ("shimmed"). Thus, the exemplary embodiment of the method and system according to the present invention also provides for an optimization of the shim values to be used so as to compensate the field variations in a specific desired subvolume of the MRI system, as opposed to more global methods that seek to optimize the signal from the whole sample within the system.

For example, starting with the mean value of the field as a "virtual" shim, it can be offset by simply suitably adjusting the frequency of the reference oscillator in the MR receiver. The orthogonalization can be carried out by systematically iterating through the successive shims, determining their inner products with the previously orthogonalized shims and subtracting the corresponding scaled shim functions from them. The remaining function is orthogonal to the previously orthogonalized shims. This function can be normalized by dividing by its norm. Any net constant field offset can be compensated for by adjusting the receiver frequency, as discussed above. Thus, using the linearity of the relationship between shim currents and their resulting shim fields and the linearity of the process of combining magnetic fields, the negative of these shim currents can be supplied to the corresponding shim coils so as to provide an optimal set of correcting fields to be used to correct for the inhomogeneity of the main field over the region. If the component along a given orthogonalized shim field is on the order of or less than the noise in the measurements, such component can be ignored, as it is unlikely to be reliable.

Accordingly, an exemplary embodiments of the system, method, software arrangement and storage medium are provided for homogenizing a main magnetic field of a magnetic resonance imaging ("MRI") system. In particular, a distribution of the main magnetic field that is generated by the MRI system can be obtained. In addition, at least one shim magnetic field distribution that is generated by at least one shim coil of the MRI system may be obtained. Further, information associated with a shim current of the MRI system may be determined based on a relationship between the main magnetic field distribution and the at least one shim magnetic field distribution.

In another exemplary embodiment of the present invention, a variation of the shim current to the at least one shim coil to homogenize the main magnetic field of the MRI system can be obtained. The variation of the shim current may be the negative of the shim current. The information may be determined by calculating a dot product of the distribution of the main magnetic field and the at least one shim magnetic field distribution. The variation can be obtained by determining at least one orthogonalized shim field using the at least one shim magnetic field distribution. This may be performed by calculating a dot product of the distribution of the main magnetic field and the at least one orthogonalized shim field. A variation of the shim current to the at least one shim coil to homogenize the main magnetic field of the MRI system may further be obtained. The variation of the shim current can be the negative of the shim current.

These and other objects, features and advantages of the present invention will become apparent upon reading the following detailed description of embodiments of the invention, when taken in conjunction with the appended claims.

Figure 1A:
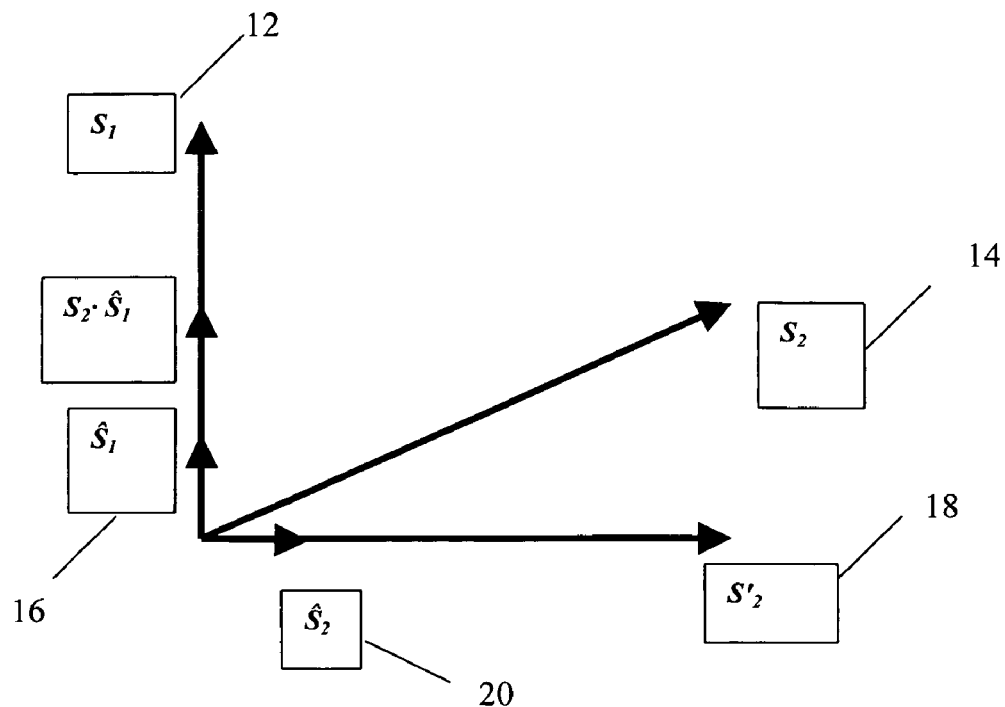
FIG. 1(a) shows an exemplary orthonormalization of two vectors.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION

One of the problems of seeking an optimal combination of shim fields to compensate for the field inhomogeneity is generally a linear problem. For example, a net field resulting from a combination of shim fields is a linear sum of the shim fields at each location, and the result of combining the net shim fields and the main magnetic field is the sum thereof. Similarly, the strength of each shim field is linearly proportional to the strength of the current passing through each shim coil. The component of the shim field along the direction of the main magnetic field is generally significant, since the other components have a negligible effect on the final field due to the greater strength of the main field. One exemplary embodiment of the present invention takes into consideration the shim fields with unit current strengths as constituting a basis set in a space of possible combined shim fields representing their linear combinations, analogous to a set of basis vectors used to generate a space of vector combinations. The observed field inhomogeneity may be projected into this space to determine the corresponding set of combinations of shim fields equivalent to the inhomogeneity.

By applying the corresponding currents to the shim coils that generate the negatives of these shim fields, an optimal shim field set is provided to compensate for the main magnetic field inhomogeneity. If the shim currents are not zero at the time of the determination of the magnetic field map, an amount to change the currents can be determined. The limited number of degrees of freedom corresponding to a particular number of the shim fields and their configuration in a given MRI system can limit the ability to compensate for the inhomogeneity. If the optimization of the field homogeneity only over a limited region of interest ("ROI") is of interest, the local performance of the shimming may be improved by restricting the projection operation to that ROI. Similarly, if field mapping is available over a limited region due to the limited physical extent of the object being imaged, the ROI calculations may be restricted to this region.

As shown in the flow diagram of the exemplary embodiment of the method according to the present invention, with a map (step 110) of the field inhomogeneity, B(r), a set of predetermined shim fields (step 120) for unit values of the shim currents, $S_i(r)$, and a desired ROI, R, the projection operation in the shim space may be considered as the inner product of the field, B, with a shim field, S, defined as the integral over the ROI of the product of the two fields:

$$B \cdot S \equiv \int_R B(r)S(r)dr. \qquad (1)$$

The effective size ("norm") of a function in such space can be defined as the square root of its inner product with itself:

$$\|S\| \equiv \sqrt{S \bullet S}. \qquad (2)$$

If the inhomogeneity is projected onto the given set of shim fields, the corresponding components might not easily be combined to obtain the net desired shim field. This would be due to the fact that the given set of shim fields generally may have some degree of overlap with each other in their effects. The process of accounting for this may be simplified by calculating an equivalent set of independent ("orthogonal") shim fields. The calculations may be further simplified by adjusting the orthogonalized shims to have unit norms (e.g., "normalizing" them), by dividing these shims by their norms. The process of generating an orthogonal set of equivalent shims may be carried out using the Gram-Schmidt orthogonalization process. This process can successively consider each of the shim fields in a predetermined order. Each shim field may be projected onto the preceding orthogonalized shims, and the corresponding components of the shim may then be subtracted there from. The residue should be orthogonal to all the previous orthogonalized shims, and can be added to the set for use in orthogonalizing the successive shims. The orthogonalized shims may also be normalized. The result of such process can be a virtual set of orthonormal ("orthonormalized") shim fields onto which the main field inhomogeneity can be projected. The resulting components may then be converted to the equivalent set of original shim fields to use to compensate for the inhomogeneity.

Figure 1B:
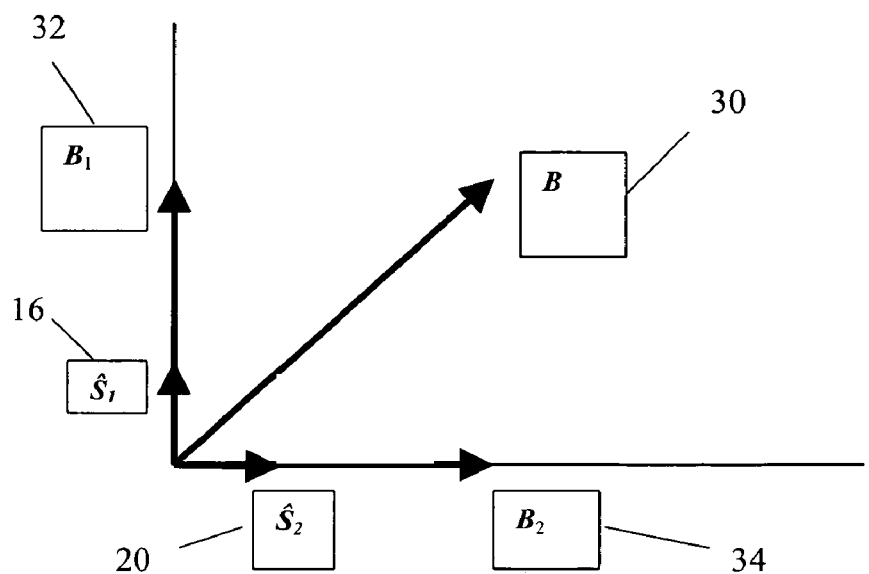
FIG. 1(b) shows an exemplary projection of a vector onto an orthonormal basis set.

FIGS. 1(a) and 1(b) illustrate a simple set of exemplary vectors to show the principle of generating and using orthonormal basis vectors. As shown in FIG. 1(a), exemplary two vectors are provided, $S_1$ 12 and $S_2$ 14. For example, the vector $S_1$ 12 can be normalized by dividing it by the length (norm) thereof to obtain a normalized basis vector, $\hat{S}_1$ 16. $S_2$ 14 can then be orthogonalized by subtracting its projection onto $\hat{S}_1$ 16: $S'_2 = S_2 - (S_2 \cdot \hat{S}_1)$. By normalizing $S'_2$ 18, a second orthonormal basis vector $\hat{S}_2$ 20 is obtained. As shown in FIG. 1(b), the components of another exemplary vector B 30 can be found in this sample basis by projecting B 30 onto the orthonormal basis vectors to determine the components $B_1$ 32 and $B_2$ 34. An exemplary combination of the original vectors that is equivalent to the vector B 30 can then be obtained.

For example, it is possible to consider N shim fields, $S_i$. The effective field may be deemed equivalent to a unit overall frequency offset of a magnetic resonance ("MR") receiver as approximately equivalent or similar to a "zero order" shim, $S_0$. The process may be initialized by normalizing the $S_0$ shim:

$$\hat{S}_0 = S_0 / \|S_0\|. \qquad (3)$$

Such expression can be provided as $$\hat{S}_0 = a_{00} S_0, \qquad (4)$$

where $$a_{00} = 1/\|S_0\|. \qquad (5)$$

In this manner, $S_1$ can be orthogonalized (see step 130 of FIG. 3) by projecting it onto $\hat{S}_0$ and subtracting the corresponding component. Then $S_1$ can be normalized:

$$S'_1 = S_1 - (S_1 \bullet \hat{S}_0)\hat{S}_0, \qquad (6)$$

$$\hat{S}_1 = S'_1 / \|S'_1\|. \qquad (7)$$

This can be rewritten as $$\hat{S}_1 = a_{11} S_1 + a_{10} S_0, \qquad (8)$$

where $$a_{11} = 1/\|S'_1\|, \qquad (9)$$

and $$a_{10} = -a_{11}(S_1 \bullet \hat{S}_0)a_{00}. \qquad (10)$$

The remaining shims may be found in an approximately similar manner. For example, the i-th shim $S_i$ may have the corresponding orthogonalized and normalized forms as follows:

$$S'_i = S_i - \sum_{j=0}^{i-1} (S_i \cdot \hat{S}_j)\hat{S}_j \qquad (11)$$

$$\hat{S}_i = S'_i / \|S'_i\|. \qquad (12)$$

This can be rewritten in terms of the initial shims as follows:

$$\hat{S}_i = \sum_{j=0}^{i} a_{ij} S_j, \qquad (13)$$

where $$a_{ii} = 1/\|S'_i\| \qquad (14)$$

$$a_{ij} = -a_{ii} \sum_{k=j}^{i-1} (S_i \cdot \hat{S}_k)a_{kj}, \qquad j < i. \qquad (15)$$

Each successive orthonormalized shim can thus be provided as a combination of the preceding shims.

After obtaining the orthonormalized shims, $\hat{S}_i$, the field inhomogeneity B, can be decomposed into corresponding components by projecting B onto them (see FIG. 3, step 140):

$$B_i = B \bullet \hat{S}_i, \qquad (16)$$

and utilizing the expansion of the orthonormalized shims in terms of the initial shims (provided in Eq. 13) to obtain the corresponding values of the initial shims:

$$B = \sum_{i=0}^{N} B_i \hat{S}_i = \sum_{i=0}^{N} \left( \sum_{k=i}^{N} B_k a_{ki} \right) S_i. \qquad (17)$$

Figure 3:
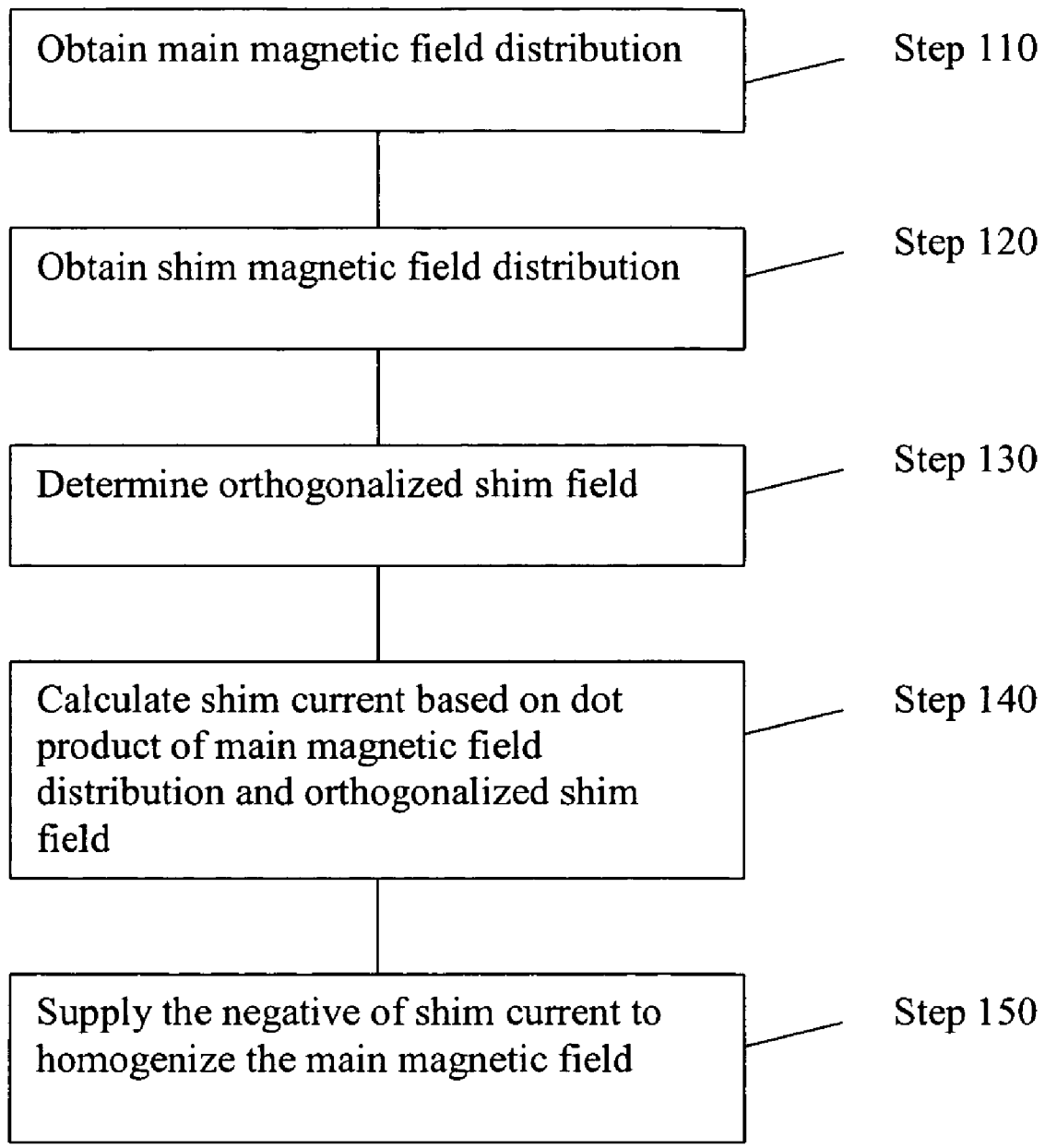
FIG. 3 shows a flow diagram illustrating an exemplary process according to the present invention in which a main magnetic field of an exemplary MRI system of the present invention is homogenized.

The negative of the shims may be provided to the exemplary embodiment of the MRI system according to the present invention to homogenize the main magnetic field (see FIG. 3, step 150).

Exemplary Experiment

To execute an exemplary test of method and system of the present invention, the above technique was implemented as in MATLAB (Mathworks, Natick, Mass.) running on a personal computer (Dell Inspiron 8100), for one-dimensional, two-dimensional and three-dimensional shim field fitting. The shim fields were modeled as polynomial functions of position. The field inhomogeneity was modeled as a combination of polynomials as well. The ROI was able to be positioned arbitrarily relative to the center of the exemplary system of the present invention.

When the order of the polynomial describing the field inhomogeneity was within the range of the shim fields, the field was fit with the shims to essentially within the precision of the computer, for a range of different values of the coefficients of the terms, without needing any iteration. The results of this exemplary test are illustrated in FIGS. 2(a)–2(f).

Figure 2A:
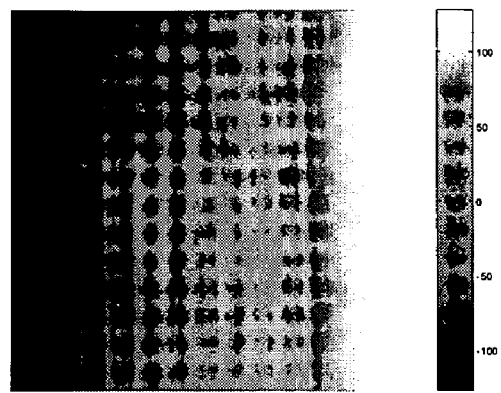
FIG. 2(a) shows an exemplary X shim field.
Figure 2B:
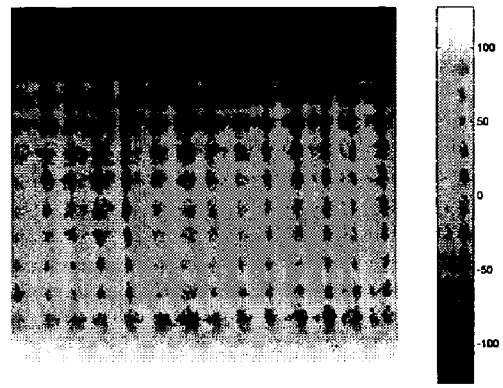
FIG. 2(b) shows an exemplary Y shim field.
Figure 2C:
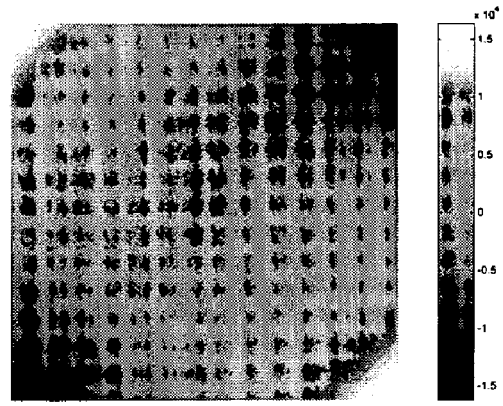
FIG. 2(c) shows an exemplary XY shim field.
Figure 2D:
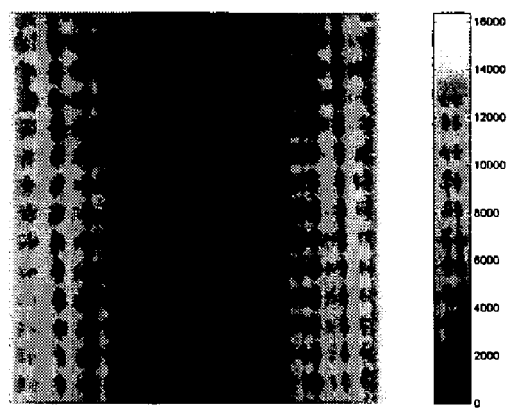
FIG. 2(d) shows an exemplary X^2 shim field.
Figure 2E:
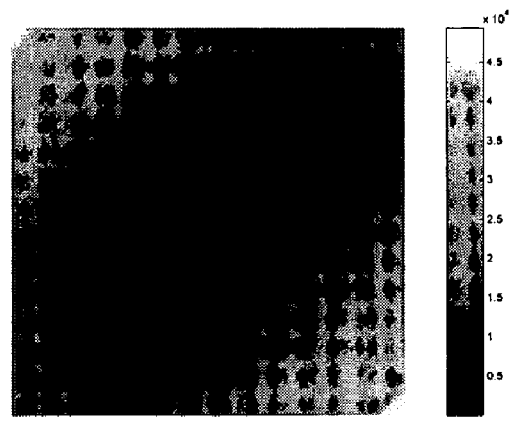
FIG. 2(e) shows the field inhomogeneity to be fit with shims.
Figure 2F:
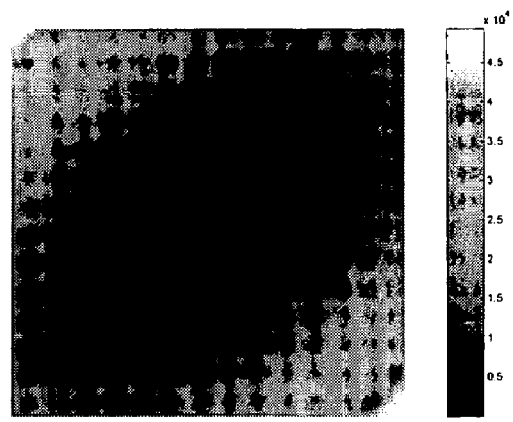
FIG. 2(f) shows results of fitting the field with shims.

For example, FIGS. 2(a)–2(d) show an exemplary set of shim fields in 2-D. The above-described exemplary orthonormalization procedure according to the present invention was used to calculate an equivalent basis set of orthonormal shim fields. The field inhomogeneity to be fit (shown in FIG. 2(e)) was then decomposed into components corresponding to the basis set, and the corresponding amounts of the initial shim fields were then easily determined. In this sample case, the inhomogeneity field (composed of a mix of second order field components) can be fit essentially exactly with a corresponding set of second order shim fields, as shown in FIG. 2(f).

In practice, the shim fields may be mapped in advance for a given MRI system of the present invention (using the same or approximately the same magnetic field mapping method that was used to determine the main field inhomogeneity). This was because there should generally be negligible change in the shim field distributions with time. If there is any uncertainty, the mapping can be repeated. If the same method is used to map both the main field and the shims, any distortions due to a gradient nonlinearity likely affect the main field and shims equally, and thus need not be explicitly compensated for. To carry out the calculations, the images of the field distributions (for both the shims and the object-specific inhomogeneity) may, e.g., be transformed to magnet-based coordinates, rather than the subject-based coordinates that are generally provided. While the calculation of the shim currents needed to compensate for an inhomogeneous magnetic field need not be iterated when using such exemplary method, the field inhomogeneity itself may possibly cause errors in the map of the field as determined with imaging methods. Thus, a repeat calculation may be needed after applying the field corrections, and remapping the field.

These exemplary method and system of the present invention provide flexibility by enabling a restriction of the shim fitting to any desired ROI. If the object being mapped to determine the field inhomogeneity has low signal areas, the ROI may be masked so as not to consider those areas. The field mapping procedure generally yields two data sets, e.g., the field map and a corresponding signal amplitude map. The ROI will probably generally be more readily defined from the signal amplitude image.

The speed of the calculations, by using the stored shim fields and orthogonalizing them for a desired ROI as needed, without needing multiple iterations, is another advantage of these exemplary method and system relative to conventional methods and systems.

The ability to rapidly shim over a desired ROI is likely useful both for spectroscopy and imaging, particularly for imaging methods that are sensitive to field inhomogeneity, such as echoplanar or steady state free precession imaging. This is particularly the case at higher magnetic field strengths, where susceptibility effects of the object to be imaged may be more pronounced, as well as in regions of the body that are more magnetically inhomogeneous, such as near air-filled regions.

Figure 4:
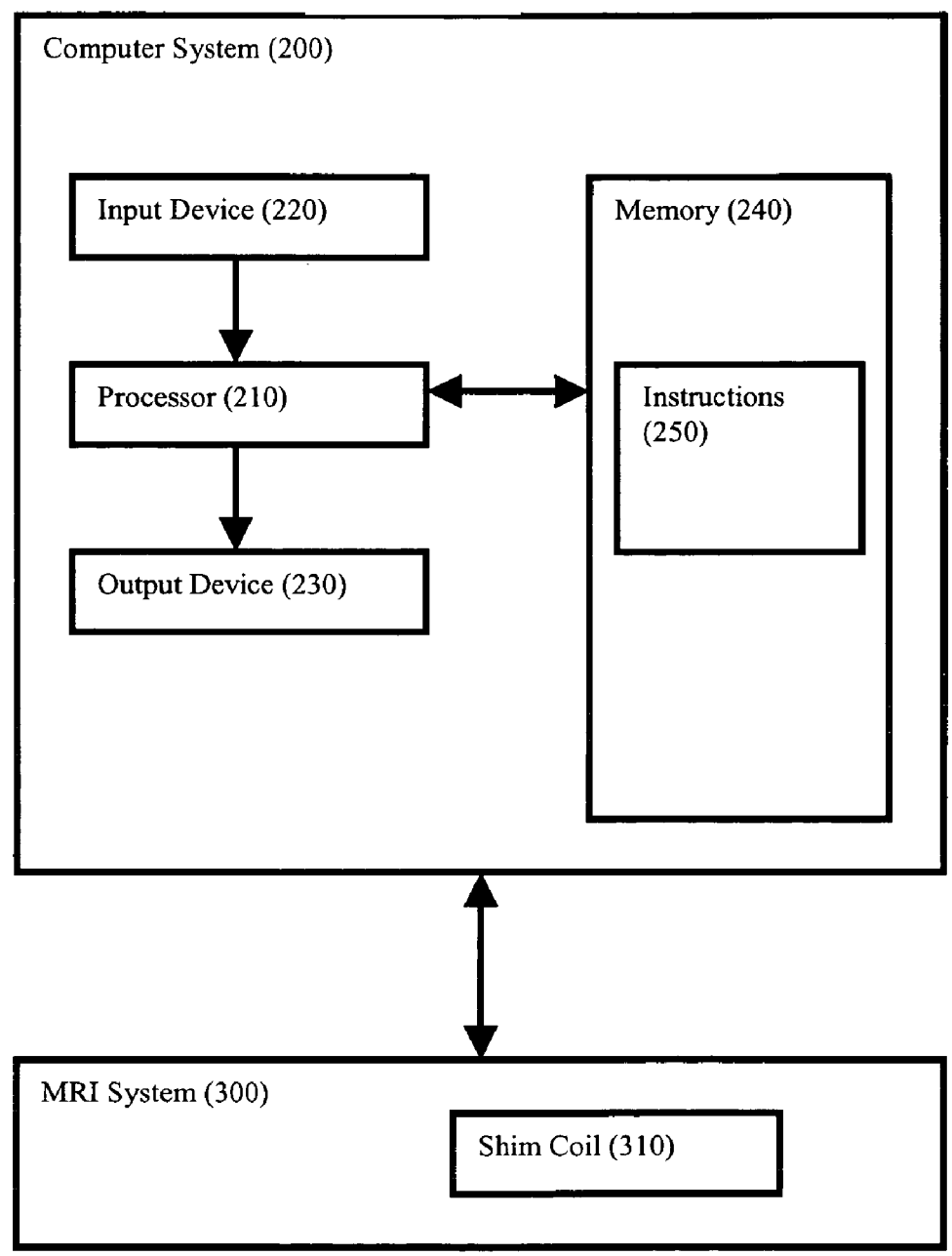
FIG. 4 shows a block diagram of one exemplary computer system according to the present invention.

Applications of the exemplary embodiments of the present invention may be implemented as a software program, either directly by the computer controlling the imaging system or by a separate computer, with the calculated desired shim values being provided to the MRI system. FIG. 4 shows a block diagram of an exemplary embodiment of a computer system 200 that controls shim fields produced by an MRI system 300. In the embodiment of FIG. 4, the computer system 200 includes computer-executable instructions 250 stored in memory 240. A processor 210 accesses the memory 240 and executes the instructions 250. An input device 220, such as a keyboard, is used to control the processor 210. An output device 230, such as a display, is used to receive an output from the processor 230 in this exemplary embodiment. Based on the execution of the instructions 250, the processor 210 controls shim fields generated by the MRI device 300 by controlling current provided to a shim coil 310.

The foregoing merely illustrates the principles of the invention. Various modifications and alterations to the described embodiments will be apparent to those skilled in the art in view of the teachings herein. It will thus be appreciated that those skilled in the art will be able to devise numerous systems and methods which, although not explicitly shown or described herein, embody the principles of the invention and are thus within the spirit and scope of the invention. All publications and references referred to above are incorporated herein by reference in their entireties.

What is claimed is:

1. A method for homogenizing a main magnetic field of a magnetic resonance imaging ("MRI") system, comprising:
   (a) obtaining a distribution of the main magnetic field generated by the MRI system;
   (b) obtaining at least one shim magnetic field distribution generated by at least one shim coil of the MRI system; and
   (c) determining information associated with a shim current of the MRI system based on a relationship between the main magnetic field distribution and the at least one shim magnetic field distribution.

2. The method of claim 1, further comprising the step of:
   (d) providing a variation of the shim current to the at least one shim coil to homogenize the main magnetic field of the MRI system.

3. The method of claim 2, wherein the variation of the shim current is the negative of the shim current.

4. The method of claim 1, wherein step (c) comprises calculating a dot product of the distribution of the main magnetic field and the at least one shim magnetic field distribution.

5. The method of claim 1 further comprising the step of:
   (e) determining at least one orthogonalized shim field using the at least one shim magnetic field distribution.

6. The method of claim 5, wherein step (e) comprises calculating a dot product of the distribution of the main magnetic field and the at least one orthogonalized shim field.

7. The method of claim 6, further comprising the step of:
   (f) providing a variation of the shim current to the at least one shim coil to homogenize the main magnetic field of the MRI system.

8. The method of claim 7, wherein the variation of the shim current is the negative of the shim current.

9. A system for homogenizing a main magnetic field of an MRI system, comprising a processing arrangement configurable to:
(a) obtain a distribution of the main magnetic field generated by the MRI system;
(b) obtain at least one shim magnetic field distribution generated by at least one shim coil of the MRI system; and
(c) determine information associated with a shim current of the MRI system based on a relationship between the main magnetic field distribution and the at least one shim magnetic field distribution.

10. The system of claim 9, wherein the processing arrangement is further configurable to provide a variation of the shim current to the at least one shim coil to homogenize the main magnetic field of the MRI system.

11. The system of claim 10, wherein the variation of the shim current is the negative of the shim current.

12. The system of claim 9, wherein the processing arrangement determines the information by calculating a dot product of the distribution of the main magnetic field and the at least one shim magnetic field distribution.

13. The system of claim 9, wherein the processing arrangement is further configurable to perform the step of (e) determining at least one orthogonalized shim field using the at least one shim magnetic field distribution.

14. The system of claim 13, wherein step (e) comprises calculating a dot product of the distribution of the main magnetic field and the at least one orthogonalized shim field.

15. The system of claim 14, wherein the processing arrangement is further configurable to provide a variation of the shim current to the at least one shim coil to homogenize the main magnetic field of the MRI system.

16. The system of claim 15, wherein the variation of the shim current is the negative of the shim current.

17. A computer-readable medium for operating an MRI system having a set of instructions which are operable to direct a processing arrangement to perform the steps comprising of:
(a) obtaining a distribution of the main magnetic field generated by the MRI system;
(b) obtaining at least one shim magnetic field distribution generated by at least one shim coil of the MRI system; and
(c) determining information associated with a shim current of the MRI system based on a relationship between the main magnetic field distribution and the at least one shim magnetic field distribution.

18. The computer-readable medium of claim 17, wherein the set of instructions are further operable to direct the processing arrangement to provide a variation of the shim current to the at least one shim coil to homogenize the main magnetic field of the MRI system.

19. The computer-readable medium of claim 18, wherein the variation of the shim current is the negative of the shim current.

20. The computer-readable medium of claim 17, wherein the information is determined by calculating a dot product of the distribution of the main magnetic field and the at least one shim magnetic field distribution.

21. The computer-readable medium of claim 17, wherein the set of instructions are further operable to direct the processing arrangement to determine at least one orthogonalized shim field using the at least one shim magnetic field distribution.

22. The computer-readable medium of claim 21, wherein the shin field is determined by calculating a dot product of the distribution of the main magnetic field and the at least one orthogonalized shim field.

23. The computer-readable medium of claim 22, wherein the set of instructions are further operable to direct the processing arrangement to provide a variation of the shim current to the at least one shim coil to homogenize the main magnetic field of the MRI system.

24. The computer-readable medium of claim 23, wherein the variation of the shim current is the negative of the shim current.

25. A software arrangement which, when executed by a processing arrangement, configures the processing arrangement to operate an MRI system having a set of instructions which are operable to direct a processing arrangement, the software arrangement comprising:
(a) a first set of instructions which are capable of configuring the processing arrangement to obtain a distribution of the main magnetic field generated by the MRI system;
(b) a second set of instructions which are capable of configuring the processing arrangement to obtain at least one shim magnetic field distribution generated by at least one shim coil of the MRI system; and
(c) a third set of instructions which are capable of configuring the processing arrangement to determine information associated with a shim current of the MRI system based on a relationship between the main magnetic field distribution and the at least one shim magnetic field distribution.

26. The method of claim 1, wherein the main magnetic field is provided for an entire area of at least one object, and wherein the shim current is capable of being provided for a region of interest that is smaller than the entire area.

27. The method of claim 1, wherein the shim current is capable of being determined in a non-iterative manner.

28. The system of claim 9, wherein the main magnetic field is provided for an entire area of at least one object, and wherein the shim current is capable of being provided for a region of interest that is smaller than the entire area.

29. The system of claim 9, wherein the shim current is capable of being determined in a non-iterative manner.

30. The computer-readable medium of claim 17, wherein the main magnetic field is provided for an entire area of at least one object, and wherein the shim current is capable of being provided for a region of interest that is smaller than the entire area.

31. The computer-readable medium of claim 17, wherein the shim current is capable of being determined in a non-iterative manner.

32. A system for homogenizing a magnetic field of an MRI system provided for an entire area of at least one object, comprising a processing arrangement configurable to:
(a) obtain a distribution of information associated with at least one shim magnetic field generated by at least one shim coil of the MRI system; and
(b) determine data associated with a shim current of the MRI system as a function of the distribution, wherein the shim current is capable of being provided for a region of interest that is smaller than the entire area.

33. A system for homogenizing a magnetic field of an MRI system, comprising a processing arrangement configurable to:
(a) obtain a first distribution of information associated with the main magnetic field generated by the MRI system;

(b) obtain a second distribution of information associated with at least one shim magnetic field generated by at least one shim coil of the MRI system; and (c) determine information associated with a shim current of the MRI system based on a relationship between the first and second field distributions, wherein the shim current is capable of being determined in a non-iterative manner.

* * * * *